US009450545B2

(12) United States Patent
Gutta et al.

(10) Patent No.: US 9,450,545 B2
(45) Date of Patent: Sep. 20, 2016

(54) DUAL-BAND SEMICONDUCTOR RF AMPLIFIER DEVICE

(71) Applicant: Ampleon Netherlands B.V., Nijmegen (NL)

(72) Inventors: Venkata Gutta, Mook (NL); Anna Walensieniuk, Toulouse (FR); Rob Volgers, Arnhem (NL)

(73) Assignee: Ampleon Netherlands B.V., Nijmegen (NL)

( * ) Notice: Subject to any disclaimer, the term of this patent is extended or adjusted under 35 U.S.C. 154(b) by 212 days.

(21) Appl. No.: 14/267,715

(22) Filed: May 1, 2014

(65) Prior Publication Data

US 2014/0333385 A1 Nov. 13, 2014

(30) Foreign Application Priority Data

May 7, 2013 (EP) .................................. 13166882

(51) Int. Cl.
*H03F 3/04* (2006.01)
*H03F 3/193* (2006.01)
(Continued)

(52) U.S. Cl.
CPC .............. *H03F 3/193* (2013.01); *H03F 3/195* (2013.01); *H03F 3/21* (2013.01); *H03F 2200/111* (2013.01); *H03F 2200/387* (2013.01); *H03F 2200/429* (2013.01)

(58) Field of Classification Search
CPC ........................................................ H03F 3/04
USPC ..................................... 330/302, 295, 124 R
See application file for complete search history.

(56) References Cited

U.S. PATENT DOCUMENTS 3,969,752 A * 7/1976 Martin .............. H01L 23/49562
257/531
4,464,636 A * 8/1984 Dobrovolny ............ H03F 3/193
330/300
(Continued)

FOREIGN PATENT DOCUMENTS

DE    10 2008 014930 A1    9/2008
EP        1 748 487 A2    1/2007
(Continued)

OTHER PUBLICATIONS

Pitzalis Jr., Octavius, et al; "Broad-band Microwave Class-C Transistor Amplifier"; IEEE Transactions on Microwave Theory and Techniques, vol. MTT-21, No. 11; pp. 660-668 (Nov. 1973).
(Continued)

*Primary Examiner* — Patricia T Nguyen
(74) *Attorney, Agent, or Firm* — McDonnell Boehnen Hulbert and Berghoff LLP

(57) ABSTRACT

There is described a dual-band semiconductor RF amplifier device. The device comprises (a) a transistor (205) having an output capacitance ($C_O$), (b) a first shunt element (210) arranged in parallel with the output capacitance, the first shunt element comprising a first shunt inductor ($L_1$) connected in series with a first shunt capacitor ($C_1$), and (c) a second shunt element (220) arranged in parallel with the first shunt capacitor, the second shunt element comprising a second shunt inductor ($L_2$) connected in series with a second shunt capacitor ($C_2$), wherein the capacitance of the second shunt capacitor ($C_2$) is at least two times the capacitance of the first shunt capacitor ($C_1$). Furthermore, there is described a method of manufacturing a dual-band semiconductor RF amplifier device and a dual-band RF amplifier comprising a plurality of such amplifier devices.

11 Claims, 4 Drawing Sheets

(51) Int. Cl.
*H03F 3/195* (2006.01)
*H03F 3/21* (2006.01)

(56) References Cited

U.S. PATENT DOCUMENTS

| | | | |
|---|---|---|---|
| 5,117,203 A * | 5/1992 | Tennyson | H03F 1/565 |
| | | | 330/294 |
| 7,119,623 B2 | 10/2006 | Blednov et al. | |
| 2002/0030545 A1 | 3/2002 | Hashemi et al. | |
| 2004/0061214 A1 | 4/2004 | Crescenzi, Jr. | |
| 2005/0104679 A1 | 5/2005 | Blednov | |
| 2008/0117894 A1 * | 5/2008 | McMorrow | H03F 3/217 |
| | | | 370/359 |
| 2008/0231373 A1 | 9/2008 | Rahman et al. | |
| 2011/0148529 A1 | 6/2011 | Besling et al. | |
| 2012/0154053 A1 | 6/2012 | Blair | |
| 2014/0070365 A1 * | 3/2014 | Viswanathan | H01L 23/047 |
| | | | 257/531 |
| 2015/0145601 A1 * | 5/2015 | Moronval | H03F 3/211 |
| | | | 330/295 |

FOREIGN PATENT DOCUMENTS

| | | |
|---|---|---|
| EP | 1 750 298 A2 | 2/2007 |
| JP | H06 188654 A | 7/1994 |
| WO | 2006/016299 A1 | 2/2006 |
| WO | 2009/139680 A1 | 11/2009 |

OTHER PUBLICATIONS

Partial European Search Report for application 13166882.4 (Oct. 15, 2013).

* cited by examiner

DUAL-BAND SEMICONDUCTOR RF AMPLIFIER DEVICE

CROSS-REFERENCE TO RELATED APPLICATIONS

This application claims the priority under 35 U.S.C. §119 of European patent application no. 13166882.4, filed on May 7, 2013, the contents of which are incorporated by reference herein.

FIELD OF THE INVENTION

The present invention relates to the field of RF amplifiers, in particular to dual-band semiconductor RF amplifier devices.

ART BACKGROUND

A high-power discrete transistor consists of an active transistor or a parallel combination of transistors, along with impedance matching, and may be interfaced to the RF PA (power amplifier) circuit environment through a package with leads. Internal impedance matching inside the package comprises capacitors and inductors, which are used to transform from low impedance at the gate or drain of the transistor (for a common-source configuration) level to higher impedance at the package leads.

In a traditional high-power discrete transistor, the output capacitance between the drain-terminal and the source-terminal limits the bandwidth of the high-frequency power-amplifier, and can degrade performance characteristics such as output power, power gain and efficiency. A well-known technique to mitigate the adverse effects of output capacitance is to use a shunt inductor in parallel with the output capacitance.

However, connecting a shunt inductor directly between the source and drain terminals of the transistor creates a short circuit to the DC current flowing between the drain and source terminals. This DC short can be eliminated by placing a capacitor or a DC block between the shunt inductor and the electrical ground. The DC block should ideally act as a short circuit at high frequencies. This type of circuit is traditionally referred to as an integrated-shunt inductor or "Inshin" and is shown in FIG. 1.

More specifically, FIG. 1 shows a field-effect transistor (FET) 105 with terminals G (gate), D (drain) and S (source). The output capacitance of the FET 105, i.e. the capacitance between the D and S terminals, is $C_O$. The Inshin network 110 is arranged in parallel with the output capacitance $C_O$ and consists of an inductor $L_1$ connected in series with a capacitor $C_1$.

However, using an Inshin matching network at the output of a power transistor only provides impedance matching at a single frequency band with a limited bandwidth.

There may thus be a need for an improved discrete power transistor, in particular for a discrete power transistor with an improved output matching topology.

SUMMARY OF THE INVENTION

This need may be met by the subject matter according to the independent claims. Advantageous embodiments of the present invention are set forth in the dependent claims.

According to a first aspect there is provided a dual-band semiconductor RF amplifier device. The device comprises (a) a transistor having an output capacitance, (b) a first shunt element arranged in parallel with the output capacitance, the first shunt element comprising a first shunt inductor connected in series with a first shunt capacitor, and (c) a second shunt element arranged in parallel with the first shunt capacitor, the second shunt element comprising a second shunt inductor connected in series with a second shunt capacitor. The capacitance of the second shunt capacitor is at least two times the capacitance of the first shunt capacitor, such as between 2 and 20 times the capacitance of the first shunt capacitor, such as between 3 and 10 times the capacitance of the first shunt capacitor, or such as between 4 and 7 times the capacitance of the first shunt capacitor.

This aspect is based on the idea that an additional resonance frequency, and consequently impedance matching at a second frequency band, can be provided by arranging a second shunt element in parallel with the first shunt capacitor. The second shunt element comprises a second shunt inductor in series with a second shunt capacitor, the latter having a capacitance which is so large that it essentially acts as a short circuit at the RF frequency band of interest. Thereby, the second shunt inductor in combination with the transistor's output capacitance and the first shunt inductor (Inshin) can form an additional resonance circuit and thereby provide impedance matching in a second frequency band, which has a much lower center frequency of operation than that of the primary frequency band. The primary frequency band is formed by interaction between the transistor's output capacitance and the first shunt element. In other words, the second shunt element provides a second resonance frequency (the first resonance frequency is provided by the first shunt inductor (Inshin) and the transistor's output capacitance), such that a dual-band RF amplifier device results.

The transistor may (in particular) be a FET (field-effect transistor).

In the present context, the term "output capacitance" may particularly denote the total capacitance between the drain and source terminals in a state, where the transistor is biased by a nominal drain-source dc supply voltage or not connected to any additional circuitry.

In the present context, the term "shunt element" may particularly denote an element having an electrical impedance and being arranged to shunt some other element(s) or component(s).

The first and second shunt elements of the amplifier device according to this aspect constitute an output matching circuit. This output matching circuit combines with the output capacitance of the transistor to create two separate resonance frequencies, and consequently provides impedance matching in two different RF frequency bands. Thereby, dual-band RF operation is enabled by a simple additional shunt, which is easy to implement and which can be manufactured at low cost.

According to an embodiment, the capacitance of the second shunt capacitor is at least five times the capacitance of the first shunt capacitor, such as five times the capacitance of the first shunt capacitor, such as six times the capacitance of the first shunt capacitor, such as eight times the capacitance of the first shunt capacitor, or such as 12 times the capacitance of the first shunt capacitor.

By designing the second shunt capacitor to have a capacitance, which is significantly larger than the capacitance of the first shunt capacitor, it can be assured that the second shunt capacitor essentially acts as a short circuit in the entire frequency range (RF) of the dual-band amplifier device. Thereby, the second shunt inductor can interact with the remaining circuit elements to resonate at a different resonance frequency than the resonance frequency provided by the first shunt element alone.

According to a further embodiment, the capacitance of the first shunt capacitor is between 100 pF and 250 pF, such as between 125 pF and 225 pF, such as between 150 pF and 200 pF, such as between 100 pF and 200 pF, such as between 150 pF and 250 pF, such as around 175 pF. The value of the first shunt capacitor may also have an effect on the bandwidth of the lower RF frequency band. This is because the first shunt capacitor may form an additional resonance circuit together with the second shunt inductor. The capacitance of the second shunt capacitor is between 500 pF and 100 nF, such as between 600 pF and 80 nF, such as between 700 pF and 60 nF, such as between 800 pF and 40 nF, such as between 900 pF and 20 nF, such as between 1 nF and 10 nF, such as around 5 nF.

According to a further embodiment, the first shunt element is adapted to, in combination with the output capacitance, form a first resonance circuit having a first resonance frequency, and the second shunt element is adapted to, in combination with the output capacitance and the first shunt element, form a second resonance circuit having a second resonance frequency, the second resonance frequency being lower than the first resonance frequency.

In this way, the first shunt element transforms impedance from the output of the transistor to the package lead, to an impedance value which is so large (in the high-frequency band), that it can be further transformed to e.g. a 50-Ohm (or an arbitrary impedance if required) environment of the RF PA circuit.

In this embodiment, the second shunt element is designed in conjunction with the choice of values of the first shunt element, so as to allow the amplifier device to operate in frequency band having a lower center frequency than the center frequency of the frequency band provided by the first shunt element alone.

According to a further embodiment, the first resonance frequency is about 2140 MHz and the second resonance frequency is about 500 MHz.

The frequency bands of the present embodiment may in particular allow use of the dual-band amplifier device in a base station for mobile communication networks. However, it is explicitly noted that the device may be designed to provide dual-band operation in a wide range of RF bands by appropriately selecting the values for the first and second shunt elements.

According to a further embodiment, the second shunt capacitor is formed as a high-density capacitor, preferably with low losses and high-breakdown voltage.

By forming the second shunt capacitor as a high-density capacitor, the second shunt capacitor can be arranged in a compact semiconductor package together with the transistor.

According to a further embodiment, the first shunt inductor and second shunt inductor are constituted by bonding wires and/or low-loss printed inductors.

By implementing the first and second shunt inductors as bonding wires and/or low-loss printed inductors, the shunt inductors can be arranged within a small semiconductor package together with the transistor and/or other parts of the dual-band output matching circuit.

According to a further embodiment, the device further comprises an input matching circuit for providing dual-band input impedance matching.

By also providing dual-band input impedance matching, the RF performance of the amplifier device can be further improved.

According to a further embodiment, the input matching circuit comprises (a) a first input matching element arranged between an input terminal and a ground terminal, the first input matching element comprising a first input matching inductor connected in series with a first input matching capacitor, and (b) a second input matching element arranged in parallel with the first input matching capacitor, the second input matching element comprising a second input matching inductor connected in series with a second input matching capacitor, wherein the capacitance of the second input matching capacitor is at least two times the capacitance of the first input matching capacitor.

In the present embodiment, the input matching circuit functions in a similar way as described above in connection with the output side of the transistor. In particular, the input matching circuit interacts with the input capacitance of the transistor and provides two separate impedance matchings at two different RF frequency bands.

According to a second aspect, there is provided a dual-band RF amplifier, the amplifier comprising a plurality of devices according to the first aspect or any of the above embodiments, wherein the devices are arranged in parallel between an amplifier input terminal and an amplifier output terminal.

This aspect is based on the idea that a high-power dual-band RF amplifier can be provided in a simple and cost-efficient way by using a plurality of amplifier devices according to the first aspect and/or any of the above embodiments.

According to a third aspect, there is provided a method of manufacturing a dual-band semiconductor RF amplifier device, the method comprises (a) providing a transistor, the transistor having an output capacitance, (b) arranging a first shunt element in parallel with the output capacitance, the first shunt element comprising a first shunt inductor connected in series with a first shunt capacitor, and (c) arranging a second shunt element in parallel with the first shunt capacitor, the second shunt element comprising a second shunt inductor connected in series with a second shunt capacitor, the capacitance of the second shunt capacitor being at least two times the capacitance of the first shunt capacitor.

This aspect is generally based on the same idea as the first aspect and provides an effective way of manufacturing a compact dual-band semiconductor RF amplifier unit.

It has to be noted that embodiments of the invention have been described with reference to different subject matters. In particular, some embodiments have been described with reference to method type claims whereas other embodiments have been described with reference to apparatus type claims. However, a person skilled in the art will gather from the above and the following description that, unless otherwise indicated, in addition to any combination of features belonging to one type of subject matter also any combination of features relating to different subject matters, in particular a combination of features of the method type claims and features of the apparatus type claims, is considered to be disclosed with this document.

The aspects defined above and further aspects of the present invention are apparent from the examples of embodiment to be described hereinafter and are explained with reference to the examples of embodiment. The invention will be described in more detail hereinafter with reference to examples of embodiment to which the invention is, however, not limited.

DETAILED DESCRIPTION

Figure 1:
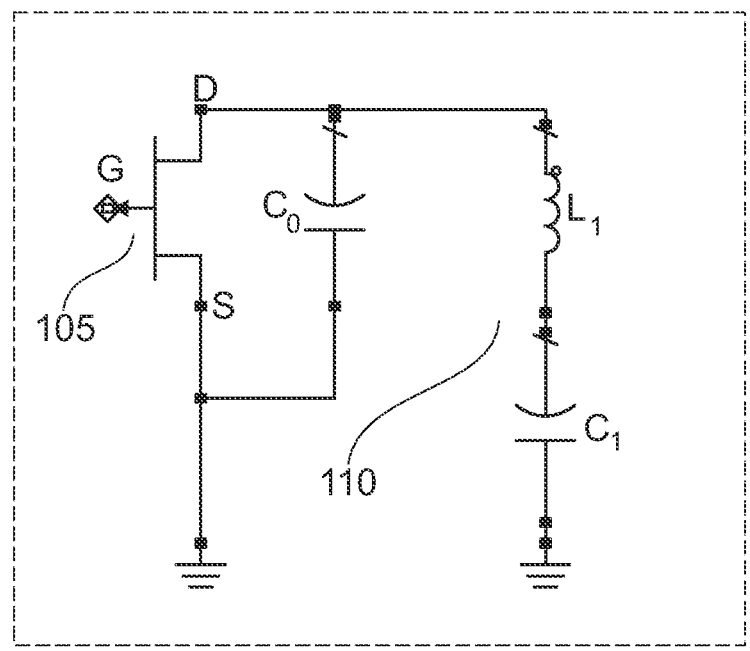
FIG. 1 shows a prior art RF amplifier device with integrated shunt inductor.

The illustration in the drawing is schematic. It is noted that in different figures, similar or identical elements are provided with the same reference signs or with reference signs, which differ only within the first digit.

Figure 2:
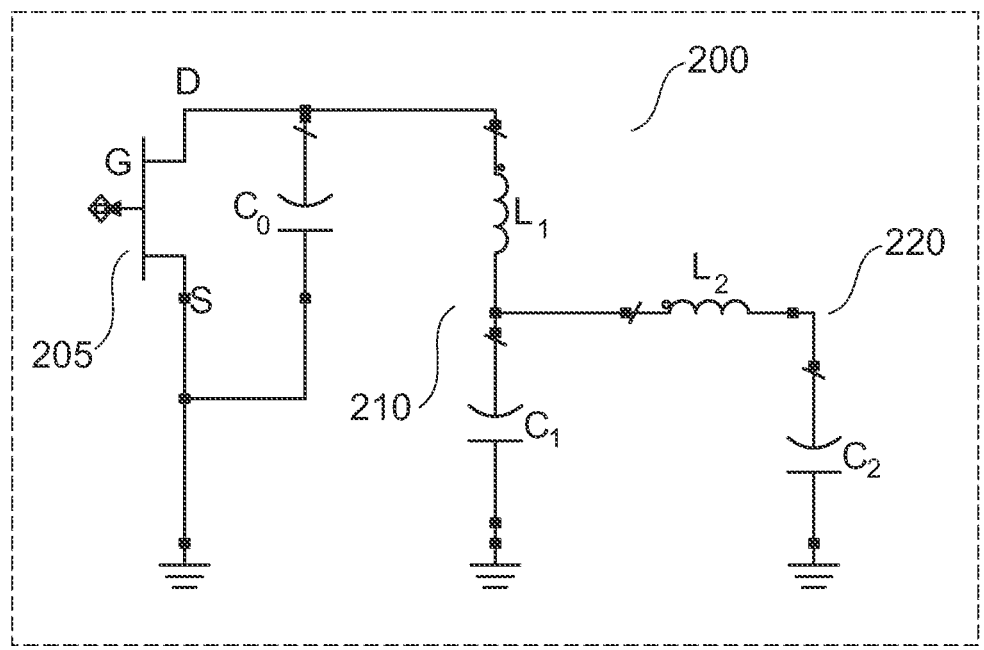
FIG. 2 shows an RF amplifier device in accordance with an embodiment.

FIG. 2 shows a dual-band semiconductor RF amplifier device 200 in accordance with an embodiment. The RF amplifier device 200 comprises a FET 205 with terminals G (gate), D (drain) and S (source). The output capacitance of the FET 205, i.e. the capacitance between the D and S terminals, is $C_O$. A first shunt element 210 is arranged in parallel with the output capacitance $C_O$ and consists of a first shunt inductor $L_1$ connected in series with a first shunt capacitor $C_1$. The first shunt element 210 corresponds to the Inshin circuit 110 shown in FIG. 1 and previously discussed. The dual-band semiconductor RF amplifier device 200 further comprises a second shunt element 220 arranged in parallel with the first capacitor $C_1$. The second shunt element 220 comprises a second shunt inductor $L_2$ and a second shunt capacitor $C_2$. The capacitance of the second shunt capacitor $C_2$ is significantly larger (by a factor two or more) than the capacitance of the first shunt capacitor $C_1$, and essentially constitutes a short circuit at RF frequencies. More specifically, the capacitance of the second shunt capacitor $C_2$ is preferably in the range from about 500 pF to about 100 nF, while the capacitance of the first shunt capacitor $C_1$ preferably is in range from about 100 pF to about 250 pF.

Figure 3A:
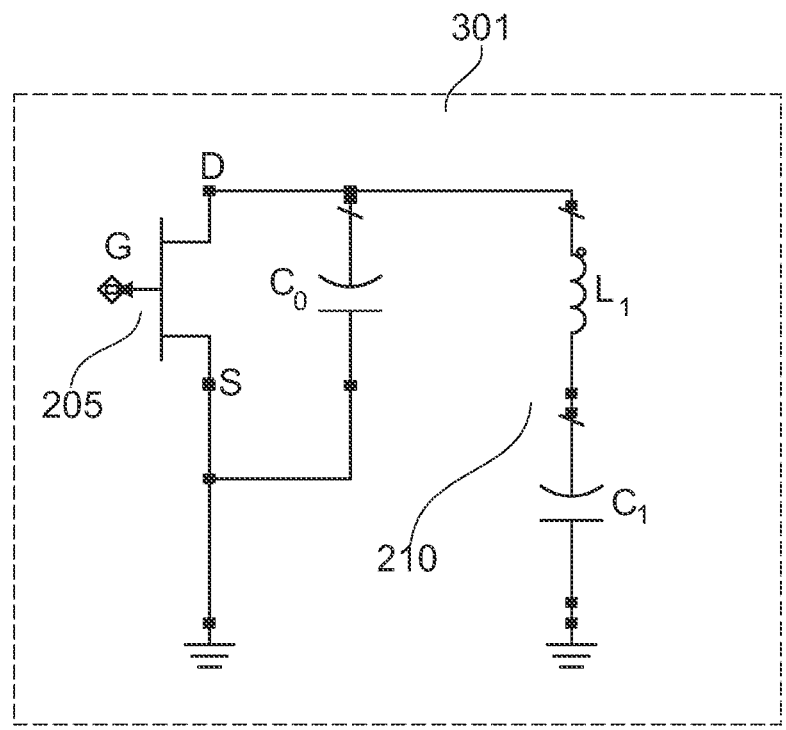
FIG. 3A shows a simplified equivalent circuit of the RF amplifier device of FIG. 2 in a high frequency band.

FIG. 3A shows an equivalent circuit 301 of the dual-band semiconductor RF amplifier device 200 of FIG. 2 in a high frequency band, i.e. the higher frequency band of the two frequency bands of the dual-band amplifier device 200. In this case, the impedance of the second shunt inductor $L_2$ is so large that the second shunt element presents a high impedance, and can be assumed to be essentially disconnected at the higher frequency band. Accordingly, the equivalent circuit 301 corresponds to the Inshin-circuit shown in FIG. 1, in which the (first) shunt inductor $L_1$ and the (first) shunt capacitor $C_1$ form a resonance circuit with the output capacitance $C_O$ of the FET 205.

Figure 3B:
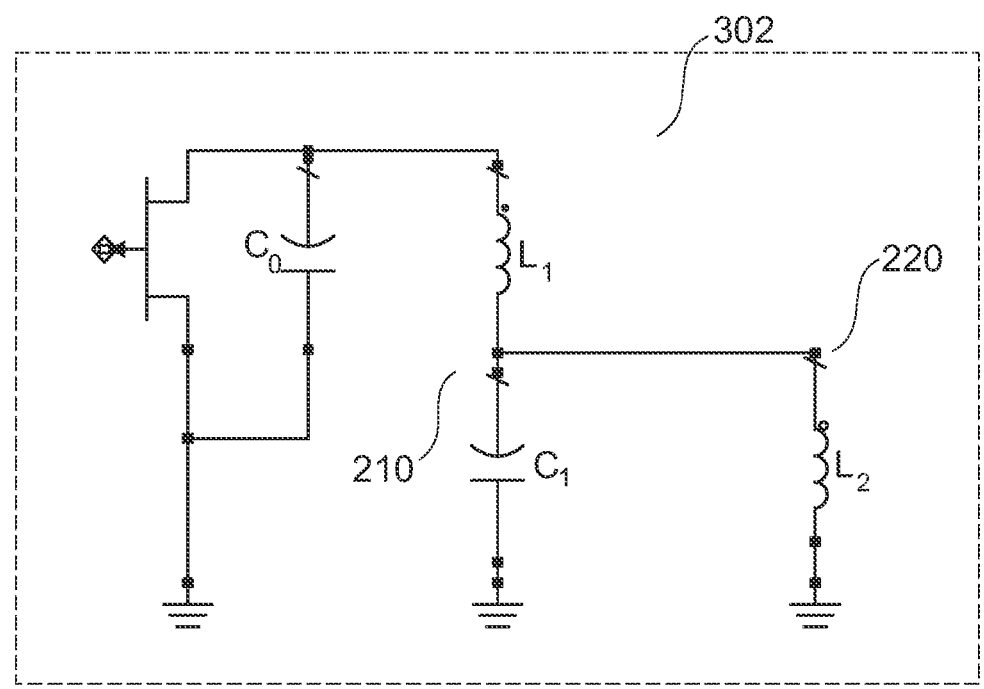
FIG. 3B shows a simplified equivalent circuit of the RF amplifier device of FIG. 2 in a low frequency band.

FIG. 3B shows an equivalent circuit 302 of the dual-band semiconductor RF amplifier device 200 of FIG. 2 in a low frequency band, i.e. the lower frequency band of the two frequency bands of the dual-band amplifier device 200. In this case, the second shunt inductor $L_2$ contributes to the resonance circuit which accordingly in this case consists of the second shunt inductor L2, the output capacitance $C_O$ of the FET 205, the first shunt capacitor $C_1$, and the first shunt inductor $L_1$. This resonance circuit has a lower resonance frequency than the one shown in FIG. 3A. The second shunt capacitor $C_2$ is not shown in the equivalent circuit 302 as it essentially constitutes a short circuit (zero impedance) at RF frequencies. When selecting the value of the shunt capacitor $C_1$, it should be taken into consideration that $C_1$ can affect the RF bandwidth of the lower frequency band as it may form a resonance circuit with the second shunt inductor $L_2$.

Accordingly, the dual-band amplifier device 205 is capable of operating in two distinct frequency bands, e.g. at 500 MHz (low band) and 2140 MHz (high band) or in any other desirable RF bands, depending on the specific application of the amplifier.

Figure 4:
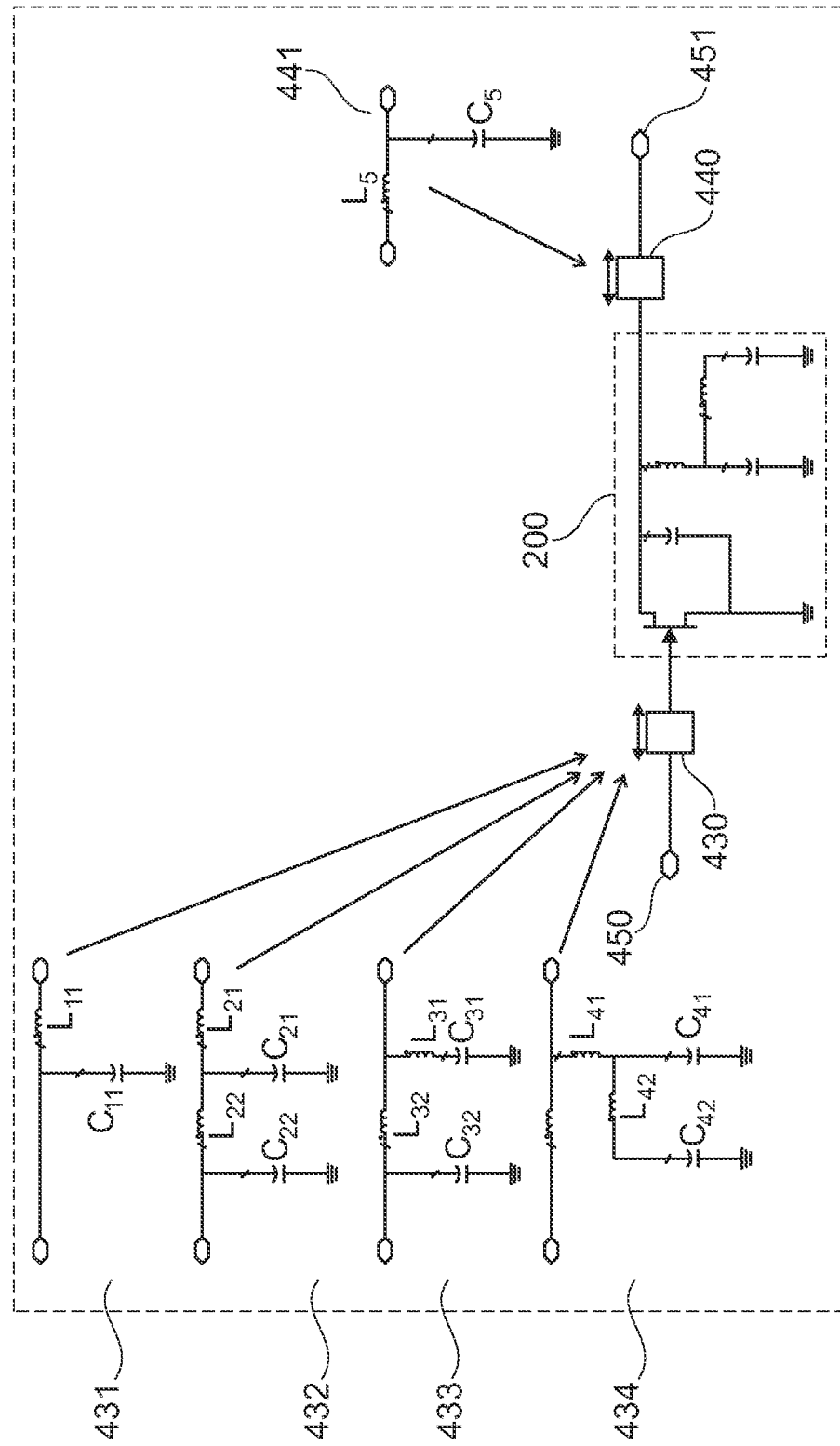
FIG. 4 shows an RF amplifier device comprising input and output matching circuits in accordance with embodiments.

FIG. 4 shows an RF amplifier device 200 further comprising an input matching circuit 430 and an output matching circuit 440. Furthermore, FIG. 4 shows four alternative input matching circuits 431, 432, 433, and 434, each of which may be used as the input matching circuit 430, and one specific embodiment 441 for use as the output matching circuit 440.

More specifically, the input matching circuit 431 is a so-called single-section low pass matching circuit comprising a capacitor $C_{11}$ and an inductor $L_{11}$. The inductor $L_{11}$ is arranged between an input terminal 450 and the gate terminal of the FET 205. The capacitor $C_{11}$ is arranged between the input terminal 450 and ground. With the circuit 431, impedance matching at the transistor input (gate terminal) is only possible at one frequency. Impedance matching can be provided at the high-band for power gain, while at the low-band the device can be mismatched since there is relatively more gain at lower frequencies.

The input matching circuit 432 is a so-called double-section low pass matching circuit comprising capacitors $C_{21}$ and $C_{22}$ and inductors $L_{21}$ and $L_{22}$. The inductors $L_{21}$ and $L_{22}$ are arranged in series between input terminal 450 and the gate terminal of the FET 205. The capacitor $C_{21}$ is arranged between the junction of the inductors $L_{21}$ and $L_{22}$ and ground. The capacitor $C_{22}$ is arranged between the input terminal 450 and ground. With the circuit 432, impedance matching at the transistor input (gate terminal) is possible for both high-band and low-band.

The input matching circuit 433 is a so-called low pass+ Inshin matching circuit comprising capacitors $C_{31}$ and $C_{32}$ and inductors $L_{31}$ and $L_{32}$. The capacitor $C_{31}$ and the inductor $L_{31}$ are arranged in series between the gate terminal of the FET 205 and ground and thereby constitute an Inshin-circuit. The inductor $L_{32}$ is arranged between the input terminal 450 and the the gate terminal of the FET 205. The capacitor $C_{32}$ is arranged between the input terminal 450 and ground. Thereby, the inductor $L_{32}$ and the capacitor $C_{32}$ constitute a low pass circuit. With this circuit 433, Inshin matching can be used to provide impedance match at the low-band, and low-pass can be used to provide impedance match at the high-band. It is easier to obtain impedance transformation using low-pass at the high-band and with Inshin at the low band.

Finally, the input matching circuit 434 is a dual-band matching circuit based on the same principle that is used on the output side of the FET 205 (see detailed description above in connection with FIGS. 2, 3A and 3B). In other words, the inductor $L_{41}$ and the capacitor $C_{41}$ are arranged in series between the gate terminal of the FET 205 to form an Inshin-circuit similar to that formed by the inductor $L_1$ and the capacitor $C_1$ between the drain terminal of the FET and ground. The inductor $L_{42}$ and capacitor $C_{42}$ are arranged in series between the junction between the inductor $L_{41}$ and the capacitor $C_{41}$ and ground. Thus, $L_{42}$ and $C_{42}$ correspond to $L_2$ and $C_2$ on the output side of the FET 205.

On the output side of the circuit 200, an optional output matching circuit 440 is arranged between the drain terminal of the FET 205 and output terminal 451. The optional output matching circuit 440 may e.g. be a low-pass circuit 441 comprising inductor $L_5$ and capacitor $C_5$ in applications that require higher impedance at the RF output package lead.

Figure 5:
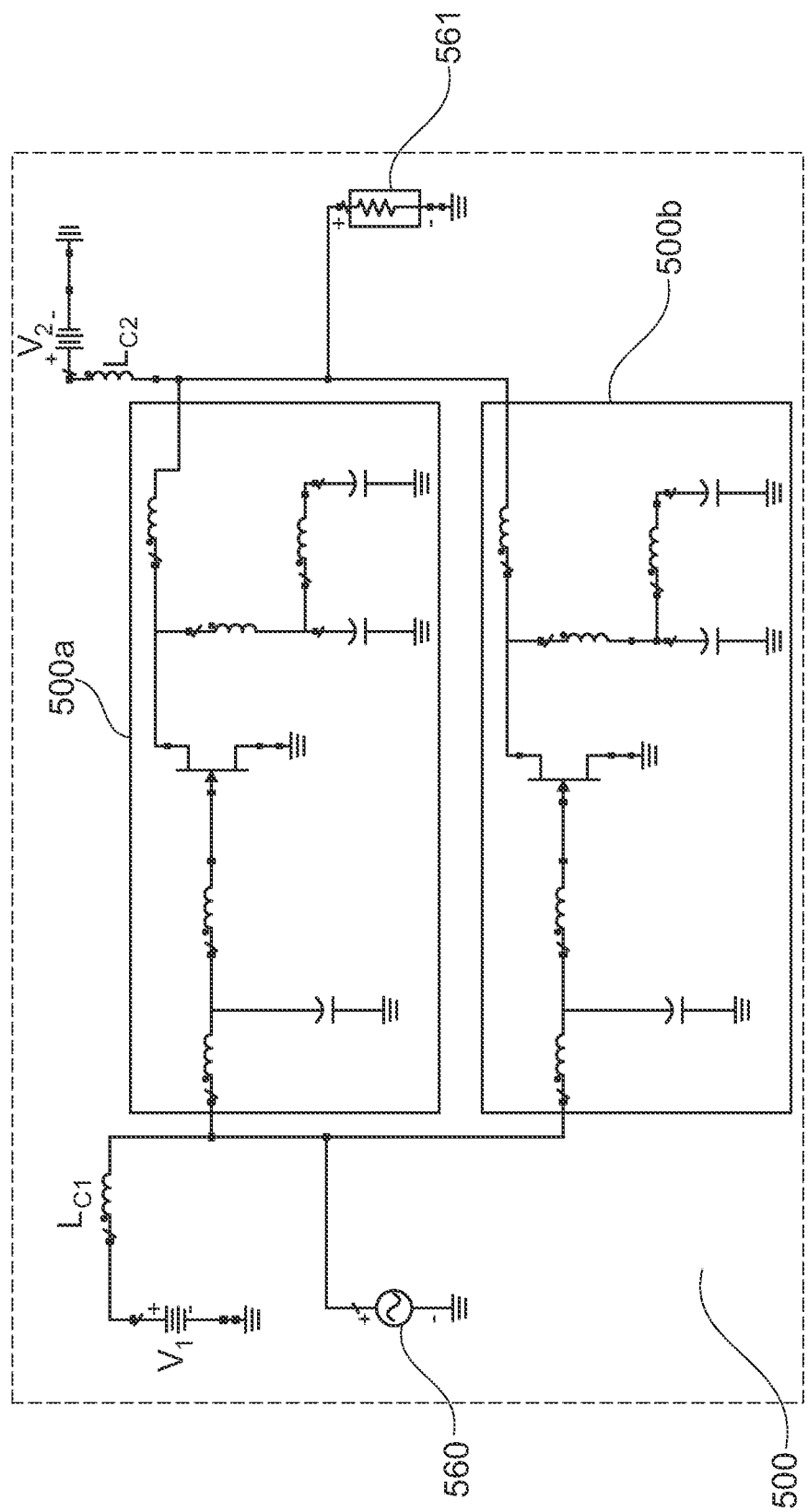
FIG. 5 shows an RF amplifier comprising two RF amplifier devices in accordance with an embodiment.

FIG. 5 shows an RF amplifier 500 comprising two identical dual-band RF amplifier devices 500a and 500b in accordance with an embodiment. Each of the two dual-band RF amplifier devices 500a and 500b work in accordance with the principles discussed above in connection with dual-band RF amplifier device 200 and differ from this only in the provision of an input matching circuit. DC voltages V1 and V2 are respectively provided at the input side and the output side of the amplifier 500 via respective RF chokes $L_{C1}$ and $L_{C2}$. The two dual-band RF amplifier devices are arranged in parallel through the connection on the RF lead of the package. The amplifier 500 is fed with input RF signal 560 and connected to output load 561. It should be noted that this embodiment may be modified if desirable by adding further dual-band RF amplifier devices in parallel with the devices 500a and 500b.

In all of the above embodiments, the transistor and matching circuits are preferably formed as a single integrated device or package. The various inductances, in particular $L_1$ and $L_2$, are constituted by bonding wires. Thereby, a simple and powerful dual-band RF amplifier is provided.

It is noted that, unless otherwise indicated, the use of terms such as "upper", "lower", "left", and "right" refers solely to the orientation of the corresponding drawing.

It should be noted that the term "comprising" does not exclude other elements or steps and that the use of the articles "a" or "an" does not exclude a plurality. Also elements described in association with different embodiments may be combined. It should also be noted that reference signs in the claims should not be construed as limiting the scope of the claims.

The invention claimed is:

1. A dual-band semiconductor RF amplifier device, the device comprising
   a transistor having an output capacitance,
   a first shunt element arranged in parallel with the output capacitance, the first shunt element comprising a first shunt inductor connected in series with a first shunt capacitor, and
   a second shunt element arranged in parallel with the first shunt capacitor, the second shunt element comprising a second shunt inductor connected in series with a second shunt capacitor,
   wherein the dual-band semiconductor RF amplifier device is configured to be able to operate at a first operating frequency and a second operating frequency, said second operating frequency being smaller than said first operating frequency,
   wherein a capacitance of the second shunt capacitor is such that it forms a short at both the first and second operating frequency,
   wherein the first shunt inductor, the second shunt inductor, and the first shunt capacitor are configured to form an inductance that resonates with the output capacitance at both the first and second operating frequency.

2. The device according to claim 1, wherein the capacitance of the second shunt capacitor is at least two times the capacitance of the first shunt capacitor.

3. The device according to claim 1, wherein the capacitance of the first shunt capacitor is between 100 pF and 250 pF and the capacitance of the second shunt capacitor is between 500 pF and 100 nF.

4. The device according to claim 1, wherein
   the first shunt element is adapted to, in combination with the output capacitance, form a first resonance circuit having a first resonance frequency that corresponds to the first operating frequency, and
   the second shunt element is adapted to, in combination with the output capacitance and the first shunt element, form a second resonance circuit having a second resonance frequency that corresponds to the second operating frequency, the second resonance frequency being lower than the first resonance frequency.

5. The device according to claim 1, wherein the first resonance frequency is 2140 MHz and the second resonance frequency is 500 MHz.

6. The device according to claim 1, wherein the second shunt capacitor is formed as a high-density capacitor.

7. The device according to claim 1, wherein the first shunt inductor and second shunt inductor are constituted by bonding wires and/or low-loss printed inductors.

8. The device according to claim 1, further comprising an input matching circuit for providing dual-band input impedance matching.

9. The device according to claim 1, wherein the input matching circuit comprises
   a first input matching element arranged between an input terminal and a ground terminal, the first input matching element comprising a first input matching inductor connected in series with a first input matching capacitor, and
   a second input matching element arranged in parallel with the first input matching capacitor, the second input matching element comprising a second input matching inductor connected in series with a second input matching capacitor,
   wherein the capacitance of the second input matching capacitor is at least two times the capacitance of the first input matching capacitor.

10. A dual-band RF amplifier, the amplifier comprising a plurality of devices according to claim 1, wherein the devices are arranged in parallel between an amplifier input terminal and an amplifier output terminal.

11. A method of manufacturing a dual-band semiconductor RF amplifier device, the method comprising
    providing a transistor, the transistor having an output capacitance,
    arranging a first shunt element in parallel with the output capacitance, the first shunt element comprising a first shunt inductor connected in series with a first shunt capacitor, and
    arranging a second shunt element in parallel with the first shunt capacitor, the second shunt element comprising a second shunt inductor connected in series with a second shunt capacitor,
    wherein the dual-band semiconductor RF amplifier device is configured to be able to operate at a first operating frequency and a second operating frequency, said second operating frequency being smaller than said first operating frequency,
    wherein a capacitance of the second shunt capacitor is such that it forms a short at the first and second operating frequency,
    wherein the first shunt inductor, the second shunt inductor, and the first shunt capacitor are configured to form an inductance that resonates with the output capacitance at both the first and second operating frequency.

* * * * *